United States Patent [19]

Hoeberechts et al.

[11] Patent Number: 4,749,849

[45] Date of Patent: Jun. 7, 1988

[54] DEVICE FOR DETERMINING THE POSITION OF A RADIATION BEAM

[75] Inventors: Arthur M. E. Hoeberechts; Date J. W. Noorlag, both of Eindhoven, Netherlands

[73] Assignee: U.S. Philips Corp., New York, N.Y.

[21] Appl. No.: 846,669

[22] Filed: Mar. 31, 1986

[30] Foreign Application Priority Data

May 24, 1985 [NL] Netherlands ........................ 8501489

[51] Int. Cl.[4] ................................................ G01J 1/20

[52] U.S. Cl. ................................ 250/203 R; 250/201; 250/211 J

[58] Field of Search ................. 250/201 AF, 201 DF, 250/203 R, 211 J; 354/403; 356/4

[56] References Cited

U.S. PATENT DOCUMENTS 4,533,826 8/1985 van Alem ........................... 250/201

4,629,882 12/1986 Matsuda et al. ............ 250/201 AF

FOREIGN PATENT DOCUMENTS 2080026 1/1982 United Kingdom .

OTHER PUBLICATIONS

Brat, J. J. M. et al, "Optical Video Disks with Undulating Tracks," *Applied Optics,* vol. 17, No. 13, pp. 2022–2028, (Jul. 1, 1978).

*Primary Examiner*—David C. Nelms

*Assistant Examiner*—Stephone B. Allen

*Attorney, Agent, or Firm*—Thomas A. Briody; Jack E. Haken

[57] ABSTRACT

In a position-sensitive radiation detector having a semiconductor body which at least in the operating condition comprises a high-ohmic zone (11) between two radiation-sensitive diodes (6) provided with connection electrodes (9), a high-ohmic zone (11) between two semiconductor zones (6) provided with connection electrodes (9), can be apparently centered by varying the voltages at the connection electrodes (9) in such a manner that the photocurrents through the diodes (6) are the same. The signals derived therefrom can be supplied to measuring and control systems for, for example, optical reading and writing apparatus and other measuring apparatus.

19 Claims, 6 Drawing Sheets

DEVICE FOR DETERMINING THE POSITION OF A RADIATION BEAM

BACKGROUND OF THE INVENTION

The invention relates to a semiconductor device for determining or controlling the position of a radiation beam. The beam is incident upon a major surface of radiation-sensitive semiconductor body provided with at least two radiation-sensitive diodes which form a rectifying junction with an adjacent part of the semiconductor body. The diodes provided with electrical connections to drain away electric current produced by the incident radiation.

The position of the radiation beam is to be understood to mean the position of the balance of the beam. As usual, the term balance is to be understood to mean the point at which the number of photons incident per unit time is the same on either side of this point. With symmetrical beams this point coincides with the axis of the beam.

Radiation-sensitive semiconductor devices of the aforementioned kind are used, for example, in photosensitive circuit arrangements for picture display and in arrangements for tracking or positioning light beams (or beams of radiation of other kinds). Other applications of radiation detection are in the field of spectroscopic analysis, especially in the wavelength range of from 200 to 1100 nm, and, for example, soft X-ray radiation. Such arrangements are also used for detection of particle radiation (for example electrons, $\alpha$ particles or high-energetic particles). Such semiconductor devices (especially in the wavelength range of visible light) are also used in measuring apparatus for position determination, for example for measuring a bend, or, for example, in automatic assembly lines.

The invention further relates to a focus error detection system provided with a semiconductor device according to the invention and to an arrangement for reading and writing information in a radiation-recording surface of a record carrier, which arrangement is provided with such a focus error detection system.

A semiconductor device of the kind mentioned in the opening paragraph is described in the Netherlands Patent Application No. 8003906 of the Applicant laid open to public inspection on Feb. 1st 1982. This Application describes a focus error detection system for detecting a deviation between a first radiation-reflecting surface and a second focusing surface of an objective system (for example for a compact disk or video disk arrangement), in which a so-called quadrant diode is utilized.

The quadrant diode described therein acts very rapidly, indeed, and has a transition curve of high steepness. But during mounting, the diode has to be mounted so that with correct focusing the radiation beam strikes the semiconductor surface exactly between the four quadrants of the diode. In view of the tolerances then required (the relative distance of the quadrants is approximately 5 $\mu$m), such a mounting process with associated adjustment is difficult and time-consuming.

Similar mounting problem arise in a focus error detection system in which a beam splitting element followed by a radiation-sensitive detection system comprising a plurality of detectors separated from each other by narrow strips is arranged in the path of the beam reflected by the radiation-reflecting surface, the subbeams formed by the beam-splitting element being incident upon the separation strips. In the latter case, it can be ensured that the centres of the radiation spots formed by the subbeams in the detector surface are incident upon the separation strips with a correct focusing by causing the separation strips to enclose an acute angle with each other. By means of a mechanical displacement of the detector surface, a correct initial adjustment can then be obtained, as is described more fully in Netherlands Patent Application No. 8202058 of the Applicant. This mechanical adjustment may vary with time and/or with temperature, however, after which a new and often labarious adjustment of the detector plane is necessary.

SUMMARY OF THE INVENTION

The invention has for its object to provide a semiconductor device of the kind mentioned in the opening paragraph, which can be used inter alia in such a focus detection system, in which the zero adjustment can be effected in a considerably simpler manner. Such a semiconductor device can further be designed and used for applications other than the aforementioned applications.

According to the invention, a device of the kind described in the opening paragraph is characterized in that at least in the operating condition a current channel in the form of a high-ohmic zone is located between the diodes. The device is further provided with an adjustment circuit by which the rectifying junctions associated with the diodes can be biased with such a relative difference that, independently of the location at which the radiation beam strikes the major surface between the diodes, the electric currents produced through the two diodes are substantially the same.

The invention is based on the recognition of the fact that in such a semiconductor device a simple electromechanical or electronic zero adjustment is possible by utilizing the differential current through the diodes. This adjustment replaces in the case of the focus detection system the mechanical adjustment (displacement and locking). Thus, a less accurate mounting is sufficient, while nevertheless a satisfactory high-frequency behaviour is maintained. The said zero adjustment may be effected, for example, by means of a variable resistor or via a potentiometer circuit, in which event in the electronic circuit variations in the photocurrent produced are also taken into account.

It will be appreciated that the balance zero adjustment is not necessarily situated at the same distance from the diodes and can be displaced by modification of the bias voltage of one or both diodes along their connection line. The adjustment system in which the device is included adjusts the position of the incoming radiation in such a manner that the balance of the incoming radiation beam with the exception of a minimum error signal) coincides with the zero adjustment or calibration adjustment.

The said diodes may be metallic zones forming a Schottky-junction with the adjustment semiconductor material. Preferably, however these diodes are formed by semiconductor zones forming pn-junctions with an adjacent part of the semiconductor body.

The photocurrents detected by the diodes may be recorded directly, if desired, for further signal processing. Preferably, however, the adjustment circuits for the zero adjustment produce output signals which are related to the diode currents.

BRIEF DESCRIPTION OF THE DRAWING

The invention will now be explained more fully with reference to a few embodiments, in which

FIG. 10 shows the associated electronic processing circuit, while

DESCRIPTION OF THE PREFERRED EMBODIMENT

Figure 1:
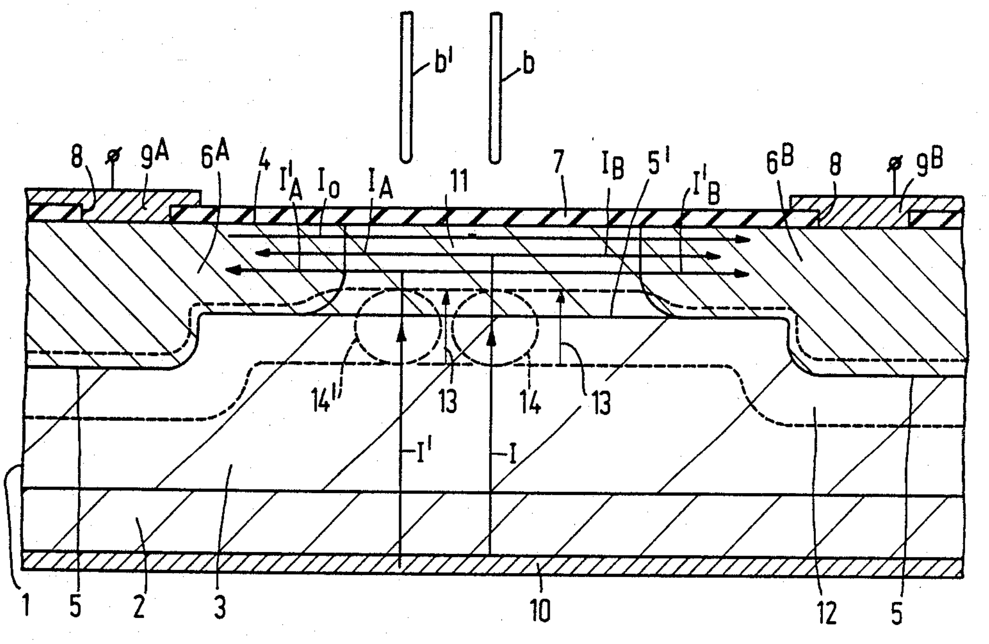
FIG. 1 shows a cross-section of a part of a semiconductor device, with reference to which the basic idea of the invention will be described.

The Figures are schematic and not drawn to scale, while in the cross-sections especially the dimensions in the direction of thickness are strongly exaggerated for the sake of clarity. Semiconductor zones of the same conductivity type are generally cross-hatched in the same direction; in the different embodiments, corresponding parts are generally designated by the same reference numerals.

FIG. 1 shows diagrammatically in cross-section a part of a semiconductor device according to the invention. This device comprises a semiconductor body 1 of silicon. This semiconductor body 1 comprises a low-ohmic substrate 2 on which is formed an epitaxial layer 3 having a thickness of approximately 10 μm and a resistivity of the order of 20 to 200 Ωcm. The semiconductor body 1 is provided at a practically flat surface 4 with radiation-sensitive diodes having rectifying junctions 5, 5'. The semiconductor body 1 is provided for this purpose at its surface 4 with semi-conductor zones 6 of the p-type, which form with the epitaxial layer 3 rectifying junctions 5 (pn junctions in this embodiment); the surface zone 11 located between the semiconductor zones 6 forms with the adjacent part of the epitaxial layer 3 a rectifying junction 5'.

The surface 4 of the semiconductor body 1 is further covered with a passivating anti-reflection layer 7 of silicon oxide or silicon oxide with, for example, silicon nitride. The layer 7 is provided with contact windows 8 for conducting contacts 9 ($9^A$, $9^B$). On the lower side of the semiconductor body, the substrate 2 is contacted by means of a contact metallization 20.

By means of an electrical voltage at the contacts 9, 10, the pn junctions 5, 5', can be biased in the reverse direction. As a result, a depletion region, indicated in FIG. 1 by broken lines, is formed at each pn junction 5, 5' in the epitaxial layer 3 and the associated semiconductor zones 6, 11. As far as these depletion regions extend in the epitaxial layer 3, they are denoted by reference numeral 12. The electric field lines due to electric fields prevailing in such regions 12 are indicated by arrows 13. The high-ohmic layer (11) may have such a low doping that the boundary indicated by the broken line of the depletion region at a sufficiently high bias voltage at the diodes extends practically as far as the surface. The current $I_O$ introduced by the voltage difference between the zones 6A and 6B is thus adjustable to a high extent and gradually passes into a (low) current, which is determined by "punch-through" of one diode to the other. With very low values of $I_O$, however, the high-frequency properties of the device become unfavourable because the charge carriers then obtain a mobility which is determined for the major part by the interface with the dielectric layer 7.

The high-ohmic region 11 may be realized, for example, by ion implantation, the doping of the semiconductor material between the zones 6A and 6B being substantially compensated for. The dose that causes the layer 11 to be produced is also influenced by the fixed charges present in the dielectric layer 7.

However, the high-ohmic layer 11 may also be obtained by means of a gate electrode which is transparent to the incident radiation and is applied to such a bias voltage that a current $I_O$ can flow between the zones 6A and 6B with a voltage difference between these zones. Combinations of the use of a gate electrode and ion implantation are also possible.

When a light beam or radiation beam is incident on the surface 4 of the semiconductor body 1, which has a sufficiently high energy (at least equal to the band gap of the forbidden band of the semiconductor material), additional charge carriers (holes and electrons) are generated in the semiconductor body. In the depletion regions, these additional charge carriers are dissipated due to the prevailing field and thus contribute to a photoelectric current through the pn junction 5.

If the balance of the radiation beam is incident about halfway between the semiconductor zones 6 (beam b in FIG. 1), additional charge carriers are generated in the depletion region, mainly at the area of the region 14, and these charge carriers contribute to a photocurrent I. The photocurrent I in this embodiment flows from the contact metallization 10 on the lower side and is split up at the area of the region 14 into two substantially equal subcurrents $I_A$ and $I_B$, which flow through the high-ohmic zone 11 to the semiconductor zones 6 and then to the contacts $9^A$ and $9^B$. The high-ohmic zone 11 has a width, which is a few times (for example five times) the diameter of the radiation beam b.

In practice, this width generally depends upon the tolerances of the optical system; this width is chosen so that it is of the same order as the range of said diameter of the radiation beam when the latter is focused to the optimum on the device. On the other hand, this width is preferably chosen as small as possible in connection with high-frequency properties and steepness of the transition curve of the radiation-sensitive semiconductor device.

The balance of the beam b' also shown in FIG. 1 is not incident halfway between the semiconductor zones 6 upon the surface 4. The charge carriers mainly generated in the region 14' again give rise to a photocurrent I', which photocurrent is split up at the region 14' into subcurrents $I_A'$ and $I_B'$. The charge carriers (in this case holes) which contribute to the current $I_A'$, are subjected due to the smaller distance of the region 14' from the semiconductor zone $6^A$ than that of the region 14' from the semiconductor zone $6^B$ to a smaller resistance than the charge carriers which contribute to $I_B'$. The current I' consequently now is split up into unequal parts $I_A'$ and $I_B'$ where $I_A'>I_B'$.

According to the invention, such voltages are now applied to the contacts $9^A$, $9^B$ that the region $6^B$ has supplied to it (in this embodiment) a more negative bias voltage than the region $6^A$. In the present embodiment, this gives rise to a compensation current $I_o$ in the high-ohmic region 11, which current is adjusted by means of a feedback mechanism still to be described, such as, for example, an amplifier circuit that is fed back, in a manner such that $I_A'$ effectively becomes smaller and $I_B'$ effectively becomes larger. As soon as $I_A'-I_O=I_B'+I_O$, the currents through the contacts $9^A$ and $9^B$ are substantially equal and the beam b' is apparently centred between the zones $6^A$ and $6^B$.

The dimensions of the zones 6, 11 depend, as stated, upon the application. The contacts $9^A$, $9^B$ then have such a relative spacing, however, that during operation the beam b is incident nearly always between these contacts.

If such a semiconductor device with the associated feedback mechanism is mounted in an optical system, after the whole has been assembled, the beam b can be caused to be incident apparently halfway between the zones $6^A$ and $6^B$ by applying a difference voltage to the contacts $9^A$, $9^B$. A focusing system, detection system or other optical system provided with such a device then has an electronic or electromechanical zero adjustment, which is generally considerably more rapid and simpler than a purely mechanical adjustment.

It should be noted with respect to the above considerations that, when varying the voltages (which are negative in this embodiment) at the contacts $9^A$, $9^B$, the shape of the depletion zone 12 changes slightly. However, this does not influence the proper operation of the device, as described above (compensation of the difference in photocurrent components by means of a current through the high-ohmic surface zone 11). The high-ohmic zone 11 may have in plan view various forms; it may be, for example, linear, circular or elliptical.

Figure 2:
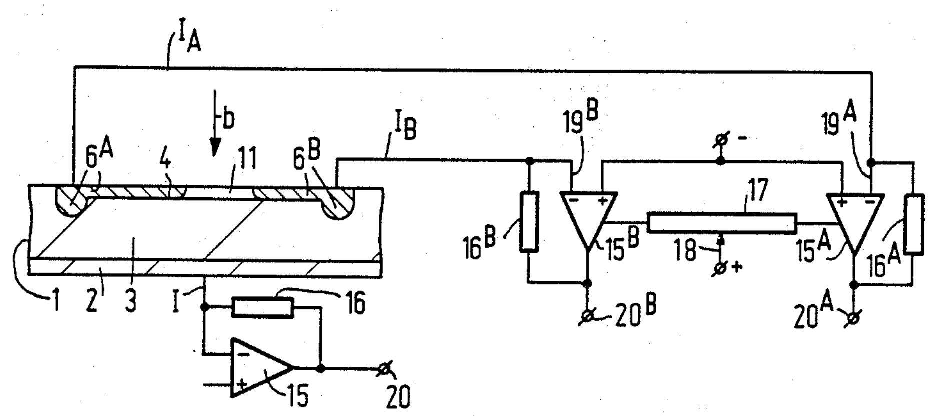
FIG. 2 shows diagrammatically an embodiment of the device according to the invention, inclusive of the adjustment circuit.

FIG. 2 shows diagrammatically how the aforementioned zero adjustment can be attained independently of the location at which the beam b strikes the surface 4. The currents $I_A$ and $I_B$ are supplied to two inputs of operational amplifiers $15^A$, $15^B$, which are fed back via feedback resistors $16^A$, $16^B$. The two remaining inputs of the operational amplifiers $15^A$, $15^B$ are interconnected and are also connected, for example, to earth.

By means of a variable voltage divider 17, whose variable connection 18 is connected to a voltage which is derived via an auxiliary circuit from the overall photocurrent I, a voltage difference can be applied between the inputs $19^A$ and $19^B$ of the operational amplifiers 15. Current variations in the photocurrents $I_A$ and $I_B$ are measured, like these photocurrents themselves, after amplification of the outputs $20^A$ and $20^B$ of the amplifiers $15^A$ and $15^B$.

The final adjustment of such a device in an optoelectronic arrangement can be made after this optoelectronic arrangement has been assembled and, for example, the focus of an objective system has been correctly adjusted. The position of an incident beam is then measured by measuring the difference of the photocurrents $I_A$ and $I_B$. With reference to this measurement, the voltage difference between the semiconductor zones $6^A$ and $6^B$ can be adjusted by means of the voltage divider 17 so that $I_A$ is equal to $I_B$ (calibration point). The beam b is then apparently centred. When the voltage difference between the semiconductor zones $6^A$ and $6^B$ is maintained, a difference in currents, measured between the outputs $20^A$, $20^B$, is now a measure for a deviation of the point of incidence of the radiation beam with respect to the said calibration point. The signal $(I_A-I_B)$ can now be used as a control signal; a deviation $\Delta I$ corresponds to a given deviation of the point of incidence of the beam b with respect to the calibration point.

Thus, a control system is obtained, which can be mounted with large tolerances and in which the calibration is effected substantially entirely electrically or electronically. Of course other circuits may be used than the variable voltage divider 17 and the operational amplifiers that are fed back (shown here diagrammatically).

The overall photocurrent I can be measured both directly and by means of an operational amplifier circuit comprising an operational amplifier 15 and a feedback resistor 16, as shown in FIG. 2.

Figure 3:
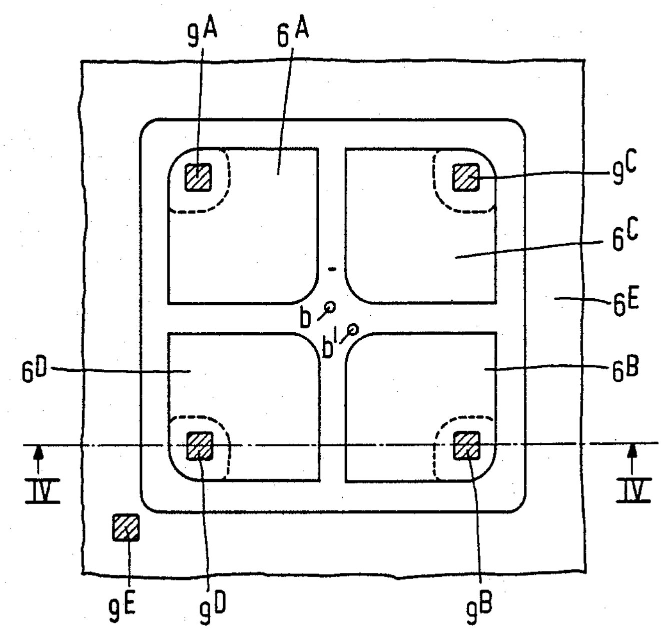
FIG. 3 shows in a plan view and FIG. 4 shows in cross-section taken on the line IV—IV in FIG. 3 another semiconductor device.
Figure 4:
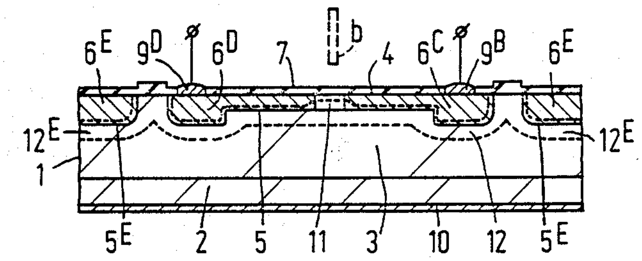

FIGS. 3 and 4 show a semiconductor device according to the invention comprising a semiconductor body 1 in which the overall photocurrent I is split up into four subcurrents $I_A$, $I_B$, $I_C$, $I_D$. If the beam b is indicent halfway between the semiconductor zones 6, as shown in FIG. 3, the photocurrents through the contacts $9^A$, $9^B$, $9^C$, $9^D$ are substantially equal. A mismatching during assembly, as a result of which, after final adjustment of the optical system, the beam is incident at b' (FIG. 3), can again be corrected in the same manner as described above.

Figure 5:
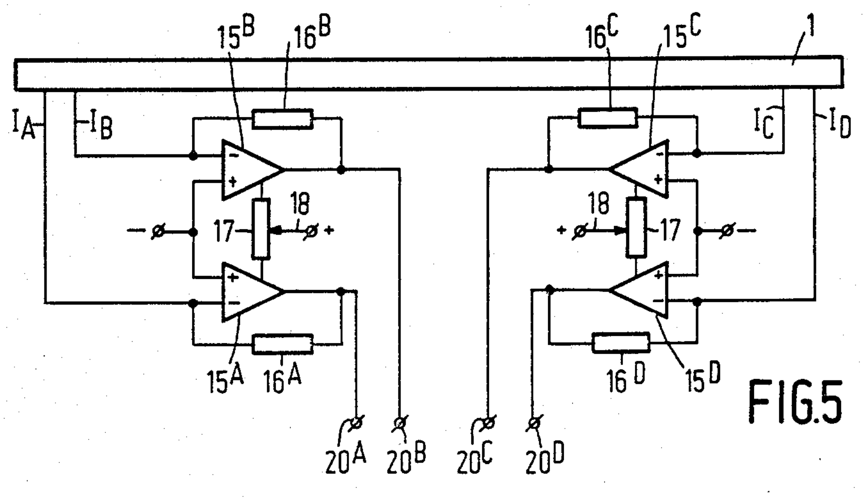
FIG. 5 shows the device of FIGS. 3 and 4 inclusive of the adjustment circuit.

FIG. 5 shows how for this purpose the sub-photocurrents $I_A$, $I_B$, $I_C$, $I_D$ originating from the contacts $9^A$, $9^B$, $9^C$, $9^D$ are supplied again to a control circuit comprising two subcircuits which are substantially equal to the circuit shown in FIG. 2. By means of the voltage dividers 17, the semiconductor zones $6^A$ and $6^B$ and $6^C$ and $6^D$ respectively, are again relatively shifted in voltage so that, when the radiation beam is incident at b', the currents $I_A$, $I_B$, $I_C$, $I_D$ are again substantially equal.

If after this calibration the position of the incident beam has slightly shifted with respect to this point b', differences in the output currents $I_A$, $I_B$, $I_C$ and $I_D$ will occur. These output currents can then be supplied again to a control system which controls the location of the incident beam in a similar manner described for a quadrant diode in the article "Optical video disks with undulating tracks" by J. J. M. Braat and G. Bouwhuis in the magazine "Applied Optics", Volume 17, No. 13, p. 2022-2028 (July 1, 1978).

The device shown in FIGS. 3, 4 comprises besides the semiconductor zones $6^A$, $6^B$, $6^C$ and $6^D$ a semiconductor zone $6^E$, which entirely surrounds these zones. The pn junction $5^E$ associated with this zone is cut off by means of a voltage source in such a manner that the associated depletion region $12^E$ contacts the depletion regions 12 associated with the pn junction 5 between the epitaxial layer 3 and the zones $6^A$, $6^B$, $6^C$, $6^D$ and 11. A voltage difference between the zone $6^E$ and the zones $6^{A-D}$ is permissible because in the intermediate region no measures are taken which influence the formation of the high-ohmic layer 11. This measure results in that charge carriers generated by light not incident upon the zones $6^A$, $6^B$, $6^C$ and $6^D$, 11 and parasitically generated charge carriers (originating, for example, from the edge of the crystal) substantially solely contribute to the current through the pn junction $5^E$ so that due to a diffusion they cannot provide parasitic contributions to a photoelectric current through one of the pn junctions 5 of the semiconductor zones $6^A$, $6^B$, $6^C$, $6^D$.

A semiconductor device of the kind shown in FIGS. 3, 4 can be manufactured by techniques generally known in the semiconductor technology. The starting material is an n-type silicon substrate 2, on which the n-type epitaxial layer is grown. The surface regions 6 are obtained, for example, by means of implantation of p-type impurities followed by a diffusion or annealing step. The surface regions 6 may also be provided directly by diffusion.

Figure 6:
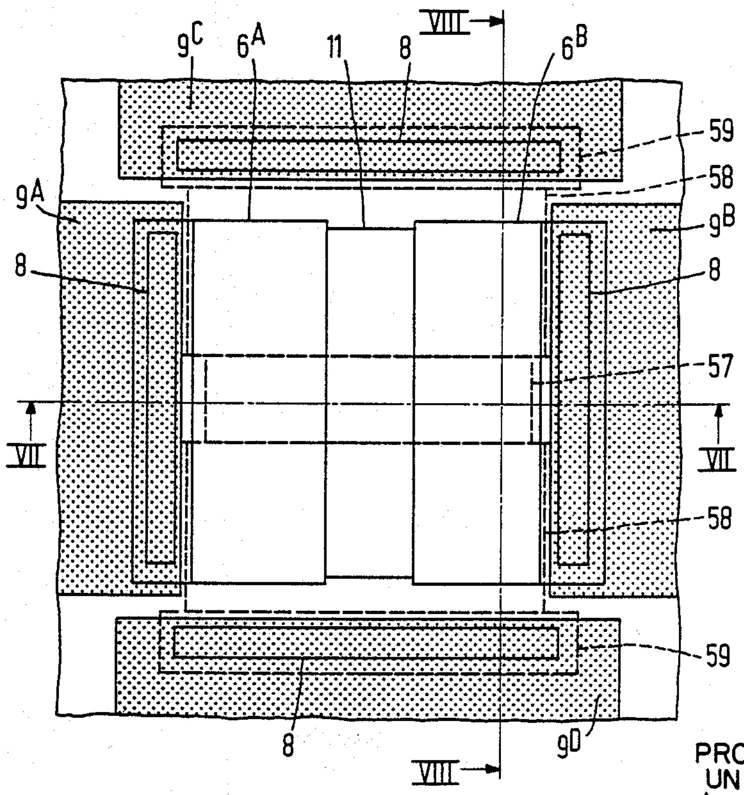
FIG. 6 shows diagrammatically a plan view of another semiconductor device according to the invention.
Figure 7:
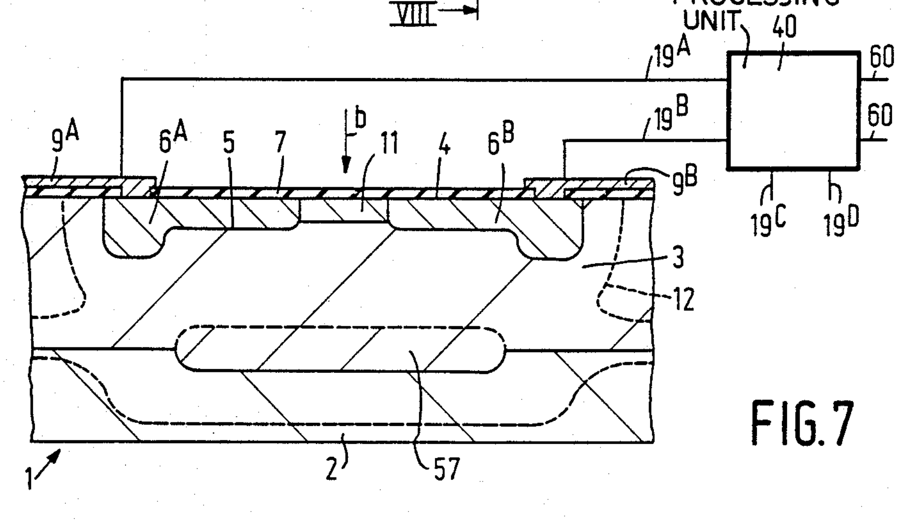
FIG. 7 shows a cross-section taken on the line VII—VII in FIG. 6.
Figure 8:
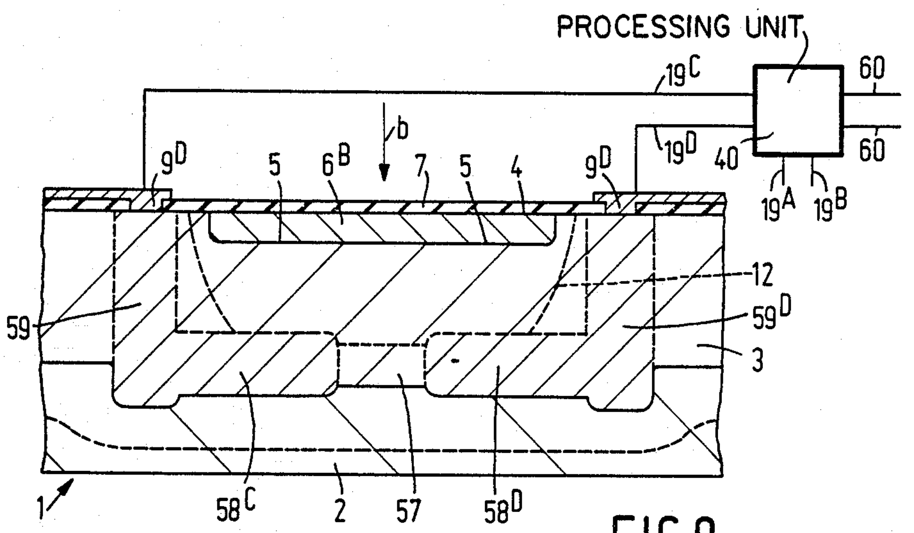
FIG. 8 shows a cross-section taken on the line VIII—VIII in FIG. 6.

Although satisfactory results can be obtained with the device of FIGS. 3, 4 in positioning in two dimensions, the transmission characteristics are not fully linear. A better linearity is obtained by means of the device shown in FIGS. 6, 7, 8, in which a second set of semiconductor zones 58 of the n-type with an interposed high-ohmic zone 57 fulfil the same function as the p-type zones 6, 11, but now in a direction at right angles to the connection between the semiconductor zones 6. Where, as stated above, holes are collected in the regions 7, 11, the n-type regions 57, 58 form potential minima for electrons generated in the semiconductor body.

The device comprises a $p^-$ or $\pi$-type substrate 2, on which an $n^{--}$ or $\nu$-type epitaxial layer is grown. Before the epitaxial growth, the buried layers 57, 58 are defined, the semiconductor zones 58 being doped more highly by selective implantation. These n-type semiconductor zones 58 are contacted via highly doped $n^+$ zones 59 and metal layers $9^C$, $9^D$. Furthermore, the device comprises at the surface 4 a similar substructure as described with reference to FIGS. 1 and 2. The metal layers $9^A$, $9^B$, $9^C$, $9^D$ are connected to the inputs $19^A$, $19^B$, $19^C$, $19^D$ of adjustment circuits of the kind described above, which form part of a processing unit 40 shown diagrammatically. Thus, a bi-dimensional system is obtained for calibrating a beam position, the adjustment of one coordinate being mainly determined by the hole current and that of the other coordinate being mainly determined by the electron current. Depending upon the application, the regions 57, 58 may have in plan view again various shapes.

The substrate 2 may also be of the n-type, provided that the doping of the regions 57, 58 is sufficiently high so that potential wells for electrons can be produced.

In the processing unit 40, the subcurrents are added again to determine the overall photocurrent, while this unit 40 supplies at the outputs 60 signals for, for example, controlling the beam b or for other applications.

Figure 9:
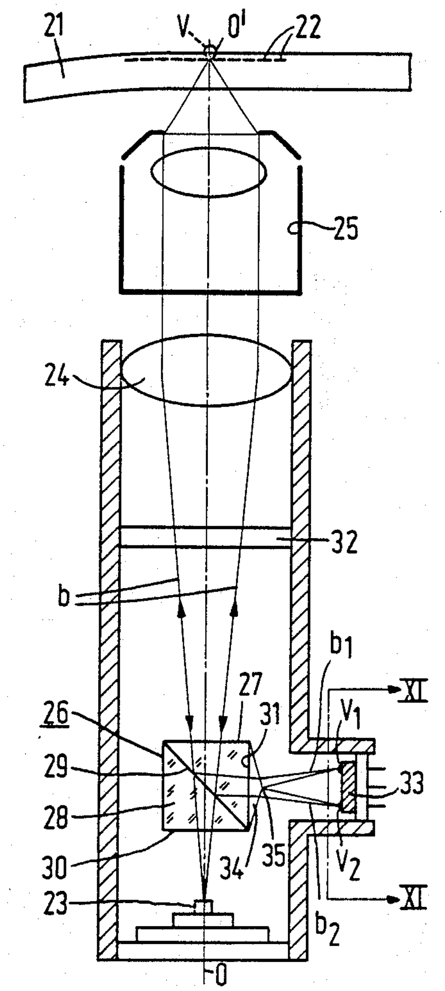
FIG. 9 shows an embodiment of an arrangement provided with a focus detection system according to the invention.

A semiconductor device according to the invention may be used, for example, in a focus detection system of the kind shown in FIG. 9. FIG. 9 shows in a radial sectional view a small part of a circular disk-shaped record carrier 21. The radiation-reflecting information structure is situated on the upper side of the record carrier and consists of a large number of information regions (not shown) which are arranged in accordance with information tracks 22. The information structure is scanned by a reading beam b supplied by a radiation source 23, for example a semiconductor diode laser. A lens 24 forms from the diverging beam a parallel beam having such a cross-section that the pupil of an objective system 25 is filled adequately. This objective system then produces a radiation spot V of minimum dimensions on the information structure.

The reading beam is reflected by the information structure and when the record carrier is moved relative to the reading beam, the reflected beam is modulated in time in accordance with the information stored in the record carrier. In order to separate the modulated beam from the beam emitted by the radiation source, a beam-splitting prism 26 is arranged between the radiation source and the objective system. This prism can comprise two prismatic parts 27 and 28, between which a beam-splitting layer 29 is provided. Reference numerals 30 and 31 denote the entrance surface and the exit surface, respectively, of the prism 26. The layer 29 may be semitransparent mirror. In order to limit the radiation loss in the reading unit to a minimum, a polarization-sensitive separation layer may be used. In this case, there has to be arranged between the objective system and the prism 26 a $\lambda/4$ plate 32, where $\lambda$ is the wavelength of the reading beam b. This prism is traversed twice by the reading beam and rotates the polarization plane of this beam through 90° in all. The beam emitted by the radiation source is then transmitted substantially completely by the prism, whereas the modulated beam is reflected substantially completely to a radiaton-sensitive detection system 33, which supplies a signal which is modulated in accordance with the information stored in the record carrier.

In order to produce a focus error signal, which given an indication about the value and the direction of a deviation between the focusing surface of the objective system and the surface of the information structure, a roof prism 34 is provided on the exit surface 31 of the beamsplitting prism 26 and the radiation-sensitive detection system 33 is composed of, for example, two radiation-sensitive devices of the kind described with reference to FIGS. 1 and 2. These two devices are denoted by reference numerals 36 and 37 in FIG. 11, which illustrates the principal of the focus error detection. This Figure shows inter alia an elevation of the semiconductor devices taken on the line XI—XI in FIG. 9 and a diagrammatic representation of the auxiliary electronic means for adjusting the difference voltages for obtaining the apparent zero adjustment.

The refracting rib 35 of the prism 34 may be parallel to the optical axis (00′ in FIG. 9) of the reading unit. Preferably, however, as shown in FIG. 9, the roof prism is arranged so that the refracting rib 35 is at right angles to the optical axis 00′. In fact a tracking error signal can then be derived from the detector signals too.

The roof prism splits up the beam b into two subbeams $b_1$ and $b_2$, which are incident upon the devices 36 and 37, respectively.

Figure 11:
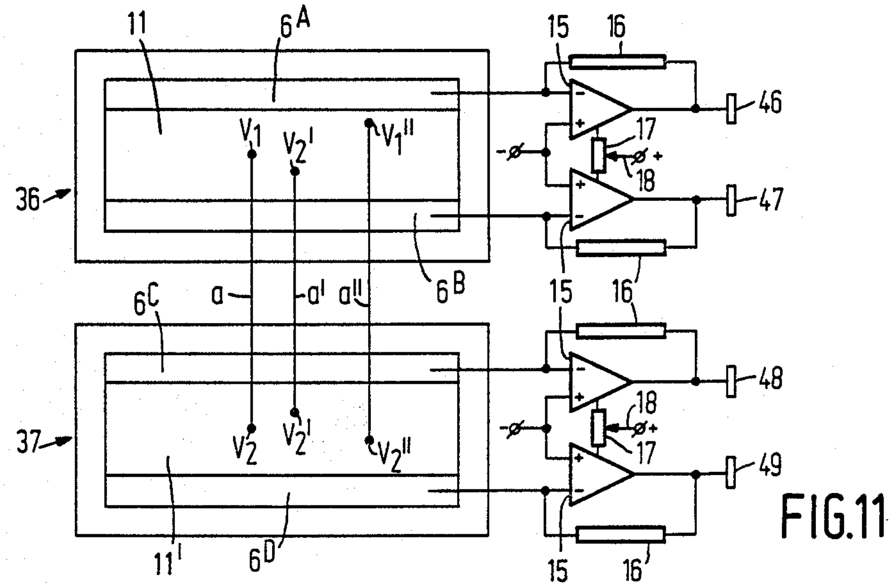
FIG. 11 shows diagrammatically a preferred embodiment of the semiconductor device as used in the arrangement of FIG. 9.

FIGS. 9 and 11 show the situation in which the reading beam is focused exactly on the surface of the information structure. The reading unit may be designed so that the focus of the reflected beam is then located exactly in the surface 2 of the semiconductor devices 1 of the detectors 36, 37, which detectors have a structure similar to that shown in FIGS. 1, 2. With a correct focusing, the subbeams $b_1$ and $b_2$ are incident symmetrically upon the high-ohmic zones 11 associated with the detectors 36 and 37 between the semiconductor zones $6^A$, $6^B$ (line a in FIG. 11).

Upon the occurrence of a focus error, the energy distribution within the subbeams $b_1$ and $b_2$, respectively, varies with respect to the associated detectors, which can also be considered as a displacement of the radiation spots $V_1$ and $V_2$ produced by the subbeams with respect to the detectors. If the focus of the beam originating from the radiation source should be located above the surface of the information structure, the beams $b_1$ and $b_2$ would be displaced inwards and the semiconductor zones $6^A$ and $6^D$ would receive less radiation energy than the semiconductor zones $6^B$ and $6^C$ (line a'). If the focus of the reading beam emitted by the radiation source should be located below the surface of the information structure, the reverse situation would apply and the semiconductor zones $6^B$ and $6^C$ would receive less radiation energy than the semiconductor zones $6^A$, $6^B$ and 19 (line a'' in FIG. 11).

It has to be ensured that with a correct focusing the balance of the radiation spots $V_1$ and $V_2$ is apparently located halfway between the zones $6^A$ and $6^B$ and the zones $6^C$ and $6^D$, respectively. In order that after the assembly any difference in photocurrent can be compensated for on behalf of a correct zero adjustment of the optical system, the arrangement of FIG. 11 again comprises a plurality of electronic control circuits, whose operation is equal to that of the preceding embodiments.

After the said zero adjustment has been effected, the signals originating from the operational amplifiers 15 can be used for signal processing. For this purpose, the signals 47 and 48 (cf. FIGS. 10, 11) which are a measure for the photo currents through the zones $6^A$ and $6^B$, are supplied to a first summator 50, while the signals 46 and 49 are supplied to a second summator 51. When the signals of these adders are supplied to a differential amplifier 52, a focus error signal $S_f$ is obtained. The information signal $S_i$ can be obtained by a third summator 53, whose inputs are connected to the outputs of the summators 50 and 51.

Figure 10:
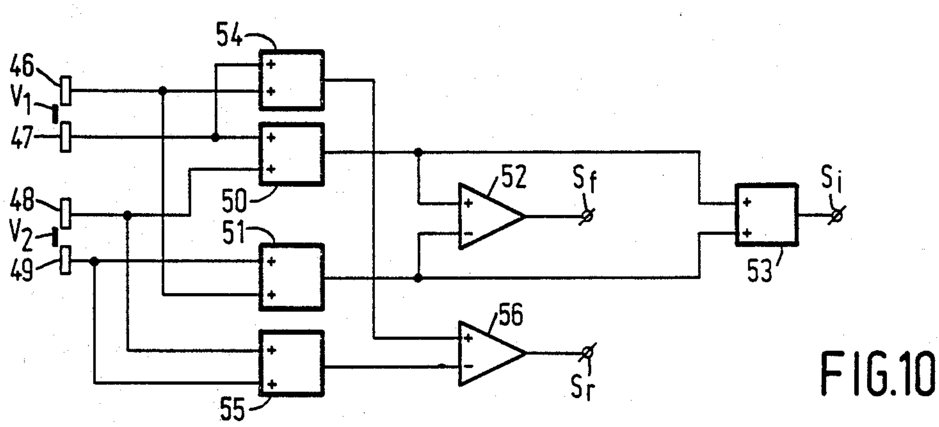

When, as shown in FIG. 9, the refracting rib 35 of the prism 34 is arranged at right angles to the optical axis 00', the radiation spots $V_1$ and $V_2$ are relatively displaced in a direction which is effectively at right angles to the track direction. In this case, a tracking signal, a signal giving an indication about the position of the reading spot V with respect to the centre of a track to be read, can be derived from the signals 46, 47, 48 and 49 originating from the operational amplifier 15 (FIG. 11). This signal $S_r$ is obtained, as indicated in FIG. 10, by supplying the signals 46 and 47 to a summator 54 and by supplying the signals 48 and 49 to a summator 55 and by supplying the signals of the summators to a differential amplifier 56. The signal $S_r$ is therefore given by:

$$S_r=(S_{46}+S_{47})-(S_{48}+S_{49}).$$

Figure 12:
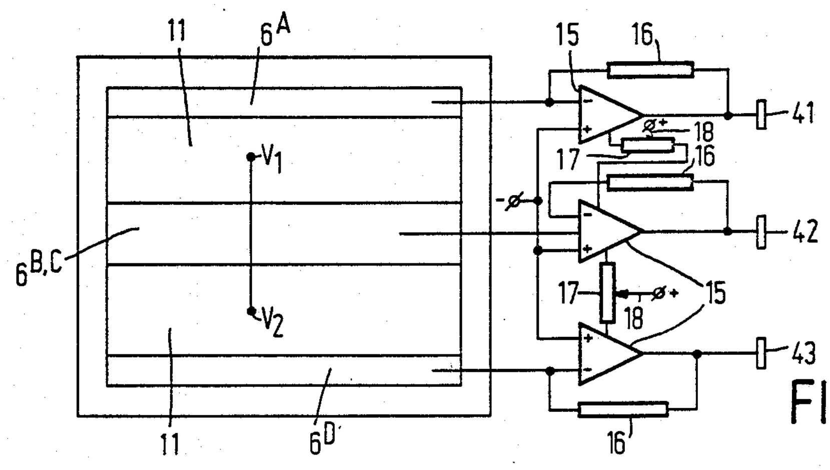
FIG. 12 shows diagrammatically a variation thereof.

If the arrangement shown in FIGS. 9, 10 is not used for producing a tracking signal $S_r$, in the semiconductor device the zone $6_B$ can coincide with the zone $6_C$, as shown in FIG. 12. The focus error signal $S_f$ is given by:

$$S_f=(S_{41}+S_{43})-S_{42}.$$

The focus detection system is described with reference to its use in an optical reading unit, but may also be used in a writing unit or in a combined writing/reading unit. The writing unit is composed in a manner analogous to that of the reading unit described. For writing information, for example by melting depressions into a metal layer, a larger amount of energy is required than for reading, while moreover the writing beam has to be modulated in time in accordance with the information to be written. As a radiation source in the writing unit, use may be made of a gas laser, such as a He-Ne laser, in which a modulator, such as an electro-optical or an acousto-optical modulator, has to be arranged in the path of the writing beam. Alternatively, a diode laser may be used, in which event the modulation of the writing beam may be obtained by variation of the electric current through the diode laser so that no separate modulator is required.

The semiconductor device shown in FIGS. 1 and 2 may also be used for measuring small displacements, for example on behalf of mechanical tests (bending, strain measurement etc.).

Figure 13:
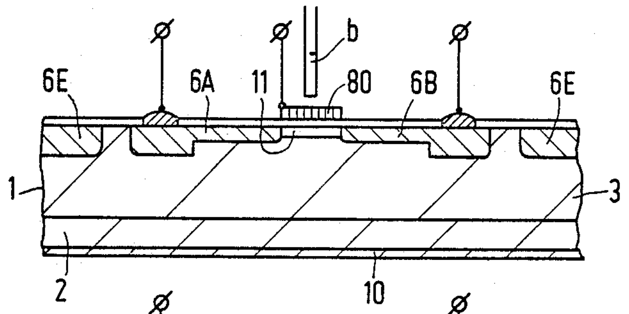
FIG. 13 shows diagrammatically a cross-section of another embodiment of the device according to the invention.
Figure 14:
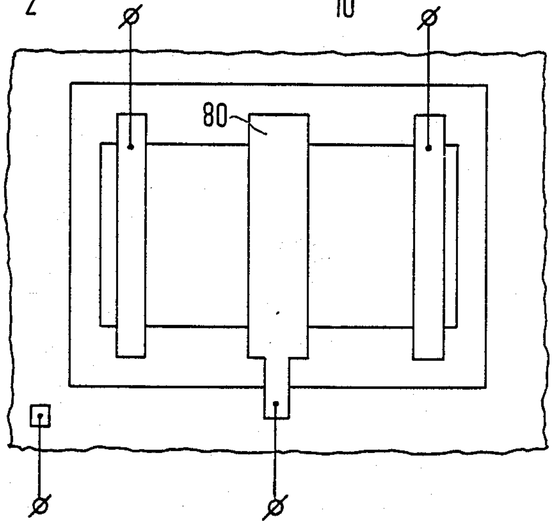
FIG. 14 is a plan view of the device shown in FIG. 13.

As already stated above, the high-ohmic layer 11 may be formed in a manner other than by doping. FIG. 13 shows diagrammatically in cross-section and FIG. 14 shows in plan view a device according to the invention, in which in the operating condition the layer 11 is formed by means of a gate electrode 80, which is transparent at least in part to the incident radiation. This gate electrode 80 is disposed on a dielectric layer 7 of, for example, silicon oxide which, as in the preceding embodiments, may also serve as an antireflection layer. The gate electrode 80 is applied to such a potential that in the operating condition a current can flow between the zones 6A and 6B if these zones are applied to different voltages. This voltage difference in turn determines the location of the calibration point on the connection line between the zones 6A and 6B. When these zones have a relative distance of, for example, 14 μm, the calibration point can be displaced electronically in this manner over about 6 μm.

Although this will mostly be the case, the high-ohmic layer 11 need not have a conductivity type opposite to that of the subjacent layer 3. In principle, it is sufficient for the layer 11 to have such a low netcharge carrier concentration that a certain "punch-through" is possible between the semiconductor zones or diodes 6A and 6B.

In the semiconductor bodies, the conductivity types of the semiconductor regions may be converted (simultaneously) whilst simultaneously adapting the electrical voltages in the adjustment system. In the arrangement of FIG. 11, the radiation-sensitive devices 36, 37 can be formed in one semiconductor body, after which mutual electrical isolation is obtained, for example, by etching a groove, which, if required may again be filled with insulating material.

Furthermore, semiconductor materials other than silicon may be used, such as, for example, germanium or compounds of the III–V type, such as gallium arsenide. Instead of by semiconductor zones 6, the depletion regions 12 may also be formed by metallic zones forming Schottky contacts on the semiconductor layer 3, which metallic zones then have to be transparent to radiation, of course. For this purpose, they are made for example of antimony-doped tin oxide or of (p- or n-type) indium oxide that may be doped with tin.

Instead of providing the semiconductor zones 6 in the epitaxial layer 3, they may also be provided directly in the substrate, in which event the substrate material has a resistivity of, for example, 10 Ω.cm. Furthermore, the high-ohmic zone need not necessarily contact the surface 4 and may be separated therefrom by a part of the substrate. Such a configuration may be obtained by providing the zones 11 by ion implantation at a high energy and is particularly suitable for detection of high-energetic particles. Moreover, the adjustment circuits may be realized advantageously in the same semiconductor body as the body in which the radiation-sensitive device (and any auxiliary electronic means) is situated.

The focus error detection system described does not utilize special properties of the optical information structure or of the surface on which focusing has to take place. It is required and sufficient only that this surface is radiation-reflecting. The focus-error detection system can therefore be used in various arrangements, in which focusing has to be very accurate, for example in microscopes.

What is claimed is:

1. A semiconductor device for determining and controlling the position of a radiation beam which is incident upon a major surface of a radiation-sensitive semiconductor body provided with at least two radiation-sensitive diodes which form rectifying junctions with an adjacent part of the semiconductor body and are provided with electrical connections to drain away electric current produced by the incident radiation, characterized in that at least in operation a current channel in the form of a high-ohmic zone is located between the diodes, while the device is further provided with an adjustment circuit by which the rectifying junctions associated with the diodes can be differently biased so that, independently of the location at which the radiation beam strikes the major surface between the diodes, the electric currents produced through the two diodes are substantially the same.

2. A semiconductor device as claimed in claim 1, characterized in that the radiation-sensitive diodes are constituted by at least two semiconductor zones of a first conductivity type, which form a pn junction with an adjacent part of a second, opposite conductivity type of the semiconductor body.

3. A semiconductor device as claimed in claim 1, characterized in that the high-ohmic zone is of a first conductivity type and forms a pn junction with the adjacent part of the semiconductor body.

4. A semiconductor device as claimed in claim 1, characterized in that means are present for forming the high-ohmic zone, said means comprising a gate electrode, which is located on a dielectric layer and is applied to a suitable potential.

5. A semiconductor device as claimed in claim 1, characterized in that the distance between the radiation-sensitive diodes amounts to a few times the width of the radiation beam.

6. A semiconductor device as claimed in claim 2, characterized in that the semiconductor body is further provided with at least two semiconductor zones of the second conductivity type opposite to the first conductivity type having electrical connections to dissipate electric current produced by the incident radiation, while a high-ohmic zone is present also between the semiconductor zones of the second conductivity type and the device is further provided with an adjustment circuit by which the semiconductor zones of the second conductivity type can be adjusted with such a difference that, independently of the location at which the radiation beam strikes the major surface, the currents produced through the semiconductor zones of the second conductivity type are substantially the same.

7. A semiconductor device as claimed in claim 1, characterized in that the adjustment circuit supplies output signals which are related to the electric currents through the semiconductor zones.

8. A semiconductor device as claimed in claim 6, characterized in that at the area of the incident radiation a connection line between the semiconductor zones of the first conductivity type encloses a substantially perpendicular angle with a connection line between the semiconductor zones of the second conductivity type.

9. A semiconductor device as claimed in claim 6, characterized in that the semiconductor zones of the second conductivity type and the high-ohmic zone form a pn junction with at least a part of the adjacent semiconductor body.

10. An opto-electronic focus error detection system for detecting in an optical system a deviation between a radiation-reflecting element and a focusing surface of an objective system, more particularly for an arrangement for reading a record carrier having an optical radiation-reflecting information structure, or an arrangement for optically-writing information into a record carrier, characterized in that the focus error detection system comprises a semiconductor device as claimed in any one of claim 1.

11. An opto-electronic focus error detection system as claimed in claim 10, characterized in that two sub-beams formed by a beam-splitting element in the path of radiation, reflected by the radiation-reflecting element, strike two high-ohmic zones of a first conductivity type located between semiconductor zones of the first conductivity type and outputs of the adjustment circuit are connected to inputs of an electronic circuit, in which a focus error is derived from signals originating from these two outputs.

12. An opto-electronic focus error detection system as claimed in claim 11, characterized in that at least one semiconductor zone of the first conductivity type is common to two adjoining high-ohmic zones of the first conductivity type.

13. An arrangement for reading or writing information in a radiation-reflecting surface of a record carrier, characterized in that the arrangement comprises a focus error detection system as claimed in any one of claims 10 to 12.

14. An arrangement as claimed in claim 13, characterized in that the radiation-sensitive semiconductor zones and the adjustment circuits are realized in the same semiconductor body.

15. A device for determining the position of a radiation beam, said device comprising:

a semiconductor body having a major surface, said body having a first region of a first conductivity type and having at least second and third regions of a second conductivity type opposite the first conductivity type, the first and second regions forming a first rectifying junction, the first and third regions forming a second rectifying junction, said semiconductor body having a high-ohmic zone arranged between the second and third regions;

means for measuring an electric current at the second region;

means for measuring an electric current at the third region; and adjustable means for providing a potential difference between the second and third regions, said means being adjustable so as to produce substantially equal electric currents at the second and third regions.

16. A device as claimed in claim 15, further comprising means for shining a radiation beam onto the major surface of the semiconductor body between the second and third regions.

17. A device for determining the position of a radiation beam, said device comprising:

a semiconductor body having a first region of a first conductivity type and having a second region of a second conductivity type opposite the first conductivity type, said first and second regions being separated by a rectifying junction, said first region comprising third and fourth contact regions and a first high-ohmic zone arranged between the third and fourth regions, said first high-ohmic zone extending from the third region to the fourth region in a first direction;

means for measuring an electric current at the third contact region;

means for measuring an electric current at the fourth contact region; and adjustable means for providing a potential difference between the third and fourth regions, said means being adjustable so as to produce substantially equal electric currents at the third and fourth regions.

18. A device as claimed in claim 17, characterized in that:

the second region comprises fifth and sixth contact regions and a second high-ohmic zone arranged between the fifth and sixth regions, said second high-ohmic zone extending from the fifth region to the sixth region in a second direction transverse to the first direction; and the device further comprises:

means for measuring an electric current at the fifth contact region;

means for measuring an electric current at the sixth contact region; and adjustable means for providing a potential difference between the fifth and sixth regions, said means being adjustable so as to produce substantially equal electric currents at the fifth and sixth regions.

19. A device as claimed in claim 18, characterized in that the first and second directions are substantially perpendicular.

* * * * *